United States Patent [19]
Grewal

[11] Patent Number: 5,529,197
[45] Date of Patent: Jun. 25, 1996

[54] POLYSILICON/POLYCIDE ETCH PROCESS FOR SUB-MICRON GATE STACKS

[75] Inventor: Virinder S. Grewal, Fishkill, N.Y.

[73] Assignee: Siemens Aktiengesellschaft, Munich, Germany

[21] Appl. No.: 359,789

[22] Filed: Dec. 20, 1994

[51] Int. Cl.[6] .................. B44C 1/22; C03C 15/00; C03C 25/06
[52] U.S. Cl. .................. 216/68; 216/67; 156/643.1; 156/345; 437/228; 437/238
[58] Field of Search .................. 156/643.1, 345 P; 216/67, 68; 437/238, 228

[56] References Cited

U.S. PATENT DOCUMENTS

| | | | |
|---|---|---|---|
| 4,561,907 | 12/1985 | Raicu | 156/643 |
| 4,659,426 | 4/1978 | Fuller et al. | 156/643 |
| 4,785,337 | 11/1988 | Kenney | 357/23.6 |
| 5,022,958 | 6/1991 | Favreau et al. | 156/643 |
| 5,106,776 | 4/1992 | Shem et al. | 437/52 |
| 5,126,916 | 6/1992 | Tseng | 361/313 |
| 5,202,275 | 4/1993 | Sugiura et al. | 437/41 |
| 5,212,116 | 5/1993 | Yu | 437/228 |
| 5,227,325 | 7/1993 | Gonzalez | 437/52 |
| 5,275,972 | 1/1994 | Ogawa et al. | 437/195 |
| 5,286,344 | 2/1994 | Blalock et al. | 156/657 |
| 5,405,480 | 4/1995 | Benzing et al. | 216/68 |

*Primary Examiner*—Richard L. Schilling
*Attorney, Agent, or Firm*—Adel A. Ahmed

[57] ABSTRACT

A method for fabricating a stacked gate array on a semiconductor wafer. The method comprises the steps of providing a reaction chamber having an upper inductive coil and a lower capacitive electrode. The upper inductive coil is adjusted to a relatively low power setting of substantially less than 300 watts. The wafer is placed into the reaction chamber and plasma etched to provide the stacked gate array.

20 Claims, 4 Drawing Sheets

POLYSILICON/POLYCIDE ETCH PROCESS FOR SUB-MICRON GATE STACKS

FIELD OF INVENTION

The present invention relates to the fabrication of integrated circuits and more particularly to a method for fabricating a polysilicon/polycide submicron gate stack.

BACKGROUND OF THE INVENTION

Polycrystalline silicon and polycides are used widely as gate materials in MOS LSI technology. The modern trend with respect to such technology, is to go to greater and greater device densities which in turn necessitates smaller minimum feature sizes and smaller separations in VLSI integrated circuits. In order to achieve these increasingly small feature sizes and separations, the lithographic pattern-transfer process must be very precise. In particular, the minimum mask dimensions that are available for a specific lithographic process substantially determines the minimum feature size and the minimum feature separation. These minimum feature sizes and separations are also dependent upon the degree of feature size change that typically occurs with a particular processing step. For example, an isotropic etching step used in the fabrication of a polysilicon gate: may produce a gate with sloping or undercut walls. Such a gate configuration would not at all be close to the lithographic gate feature size.

Hence, feature size change depends greatly upon the pattern-transfer process. Anisotropic dry etching techniques minimize feature size changes. Such techniques are required because lateral device dimensions in modern ICs are being scaled down typically below approximately 2 um while the thicknesses of the films are being scaled down less rapidly. If patterning is performed by isotropic wet or isotropic plasma etching techniques, substantial reductions in feature size including undercutting, linewidth reductions and even total loss of the etched pattern can occur.

As earlier stated, anisotropic etching techniques avoid these problems. One such technique known as plasma etching, employs a plasma coupled with an RF voltage to create a chemically active etchant that forms a volatile etching product with the unprotected layers of a substrate. This technique is made possible by the existence of suitable combinations of substrate and etching gas. Such combinations are available for the majority of the films used to fabricate semiconductor devices.

Another technique known as reactive ion etching is very similar to plasma etching and essentially differs by the operational pressures and voltages at which the equipments, used in theses processes, are operated. More specifically, RIE operates at lower pressures (approximately $10^{-2}$ Torr) than plasma etching and is thus, somewhat more directional.

Examples of typical etching gases include chlorine and fluorine compounds which are respectively available in the form of $CCl_4$ and $CF_4$. These compounds have been adapted for etching polysilicon, $SiO_2$ $Si_3N_4$, and metals. For example, fluorine radicals will react with silicon to produce a volatile silicon tetrafluoride etching product.

Oxygen containing plasmas are also employed and can be used to etch organic films including resist. Further, the etching rate of the plasma can be substantially increased by adding small percentages of $O_2$ (5–10%) to the etch gas.

Dry etching techniques, however, have etching selectivity problems. In particular, selectivity is required to pattern polysilicon gate electrodes without removing the thin underlying gate oxide, since the etching ratios needed increases in both instances as the devices become smaller. More specifically, a higher degree of selectivity for silicon dioxide relative to silicon is needed because the junction depth decreases faster than the thickness of the field oxide. Further, a higher degree of selectivity for silicon relative to silicon dioxide is a must because the thickness of the gate oxide decreases at a faster rate than the thickness of the gate electrode. Additionally, the required selectivity depends on the thicknesses of the etched and underlying films as well as on the topography produced by earlier processing steps.

Etching of gate stacks is usually performed in some type of single wafer reactor system. The reactor typically employs a top inductive coil and the bottom electrode is capacitively coupled. The coil is attached around or on top of the outside of the reactor and operate to inductively couple the rf voltage into the plasma. A pump is connected to the reactor and operates to evacuate the reactor. When RF energy is applied to the coil and to the electrode, the gas fed into the reactor is converted to a plasma.

Prior art processes for etching submicron polysilicon/polycide gate stacks on LAM-TCP employ high inductive coil power. In a typical prior art process for an OBERON gate stack etch in LAM-TCP, the top coil power is commonly adjusted to between 300 and 600 watts. The bottom electrode power is usually adjusted to between 75 and 300 watts. Chlorine, nitrogen and oxygen are employed as the etching gases. The purpose of the high top coil power is to generate high density plasma at low pressures. Such pressures are on the order of less than 10 milli-Torr. High top coil powers are employed in theses prior art etching techniques because it is a commonly held belief in the art that high plasma density is necessary to achieve adequate etch rates at low pressures. It is also commonly held belief in the art that such plasmas cause relatively little damage due to the lower kinetic energy of the ions generated in these plasmas.

The high coil powers, however, generate non-uniform plasmas which causes charging damage. Further, the high coil powers can reduce the selectivities to the gate oxide because of the high ion density. High ion density is also associated with high radical density. This can create problems because the radicals can undercut the layer being etched and/or generate a notch at the foot of the gate stack. In order to alleviate the undercut or notching, more side wall passivation is needed which can lead to undesirably large critical dimension (CD) changes.

It is therefore, a primary object of the present invention to provide a low power process for etching polysilicon/polycide gate stacks for DRAM applications.

SUMMARY OF THE INVENTION

A method for fabricating a stacked gate array on a semiconductor wafer. The method comprises the steps of providing a reaction chamber having an upper inductive means and a lower capacitive means. The upper inductive means is adjusted to a low power setting of substantially less than 300 watts. The wafer is placed into the reaction chamber and plasma etched to provide the stacked gate array.

BRIEF DESCRIPTION OF THE DRAWINGS

For a detailed understanding of the present invention, reference should be made to the following detailed description taken in conjunction with the accompanying drawings wherein.

DETAILED DESCRIPTION OF THE INVENTION

The present invention described herein is directed towards a method for anisotropically etching multilayer gate structures. The present invention is capable of etching various gate stacks comprising highly n-doped polysilicon, TiSi/polysilicon and WSi/polysilicon with a TEOS oxide cap/hard mask. Such gate stacks are frequently implemented in dynamic random access memories (DRAM).

Figure 1:
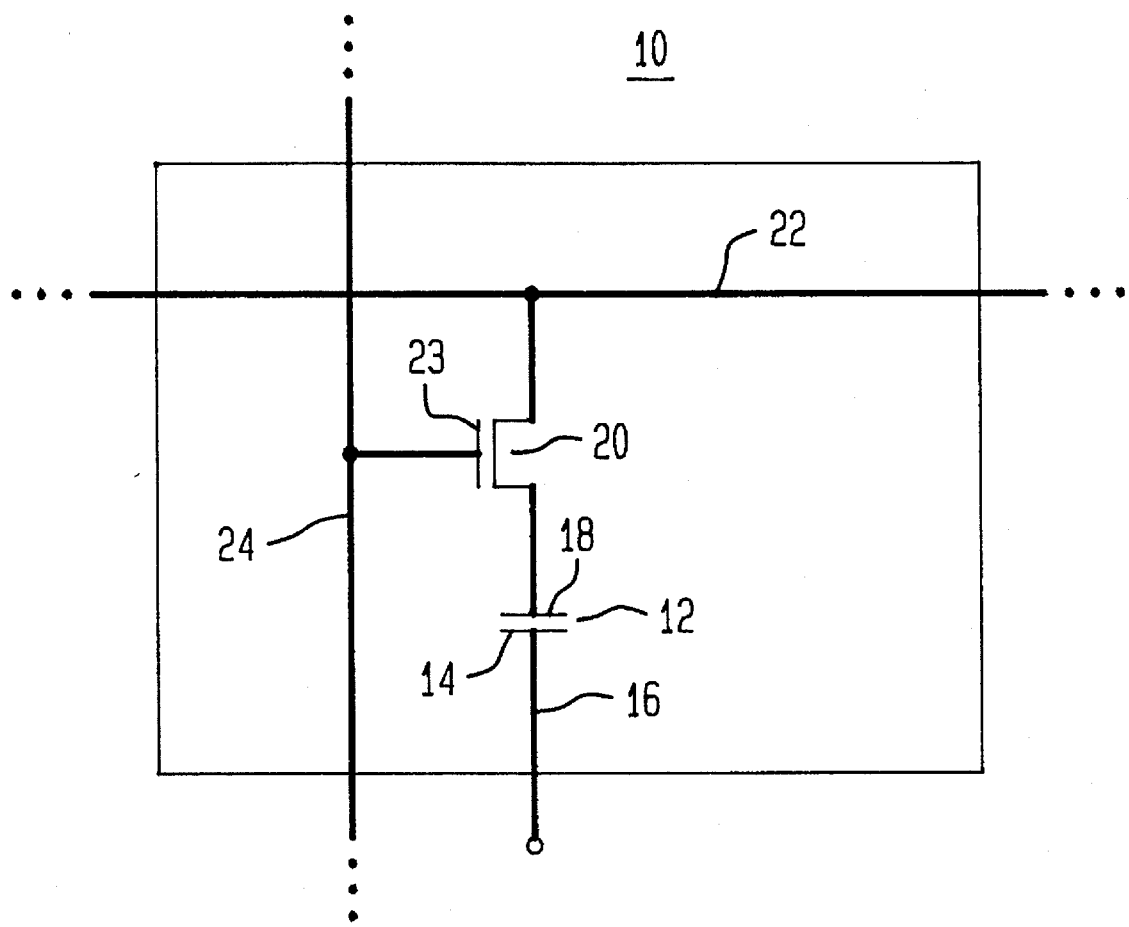
FIG. 1 is an electrical schematic of a typical one-transistor DRAM storage device.

Referring to the schematic representation of FIG. 1, there is shown a well-known prior art one-transistor DRAM device designated by the numeral 10. The DRAM device 10 comprises a capacitor 12 for storing data. The capacitor 12 has a first plate 14 which is coupled to a fixed voltage source by a line 16. The other plate 18 of the capacitor 12 is coupled through a MOS pass transistor 20 to a bit line 22. The plate 18 operates as the storage plate. The gate 23 of the pass transistor 20 is coupled to a word line 24. The operation of a DRAM 10 is well known in the art. Essentially, a row of DRAMS 10 in a rectangular array is selected by the energizing of the word line 24 selected from a row address signal received by the DRAM device. The selected word line 24 turns on the respective pass transistors 20 to which it is coupled, thus coupling the storage plates of the capacitors 12 to an associated bit line 22. Sense amplifiers (not shown) compare the resultant voltage of the bit lines 22 against a reference level to determine if there is an absence or presence of a charge on the capacitors 12 thereby indicating the status of the data stored thereon. The bit line 22 also communicates the data to be stored on the storage plate of the selected capacitors 12 during the write and restore operations.

The present invention is directed towards a method for etching OBERON submicron polysilicon/polycide gate stacks on LAM-TCP for DRAM applications such as the one described above. The present method employs a relatively low inductive coil power as compared to the aforementioned prior art technique, to produce substantially greater uniformity and substantially no undercutting or notching. As earlier described, the prior art process employs a top coil power of between 300 and 600 watts and a bottom coil power of between 75 and 300 watts. Chlorine, nitrogen and oxygen are typically employed in prior art methods as etching gases.

In the method of the present invention, the power of the top coil of the reaction chamber is preferably adjusted to between 0 and 200 watts. The power of the bottom electrode of the reaction chamber is preferably adjusted to between 50 and 200 watts. After the wafer, to be etched, is placed into the reaction chamber, the reaction chamber is evacuated down to between 5 milli-Torr and 15 milli-Torr. Etching gases are then fed into the reaction chamber and the coil and electrode are then energized to convert these etching gases into plasma. The preferred etching gases employed in the present invention are hydrogen chloride (HCL) chlorine ($Cl_2$), nitrogen ($N_2$) and oxygen ($O_2$) although any other suitable etching gases may be used.

The etching operation according to the present invention is performed in a single step and provides an etch ratio of approximately 1:1 for the materials which comprise the gate stack. The uniformity of the etch, when performed on an 8 inch wafer, is better than 5% (3 sigma). The resulting rate of etching under the above stated conditions is approximately 250 nm/min.

The etching method of the present invention provides a selectivity of silicon to oxide of between approximately 50:1 and 100:1. These type of etch selectivities are easily achieved in the present invention with minimal changes in the critical dimension between the nested and isolated lines (approximately less than 50 nm).

Figure 2A:
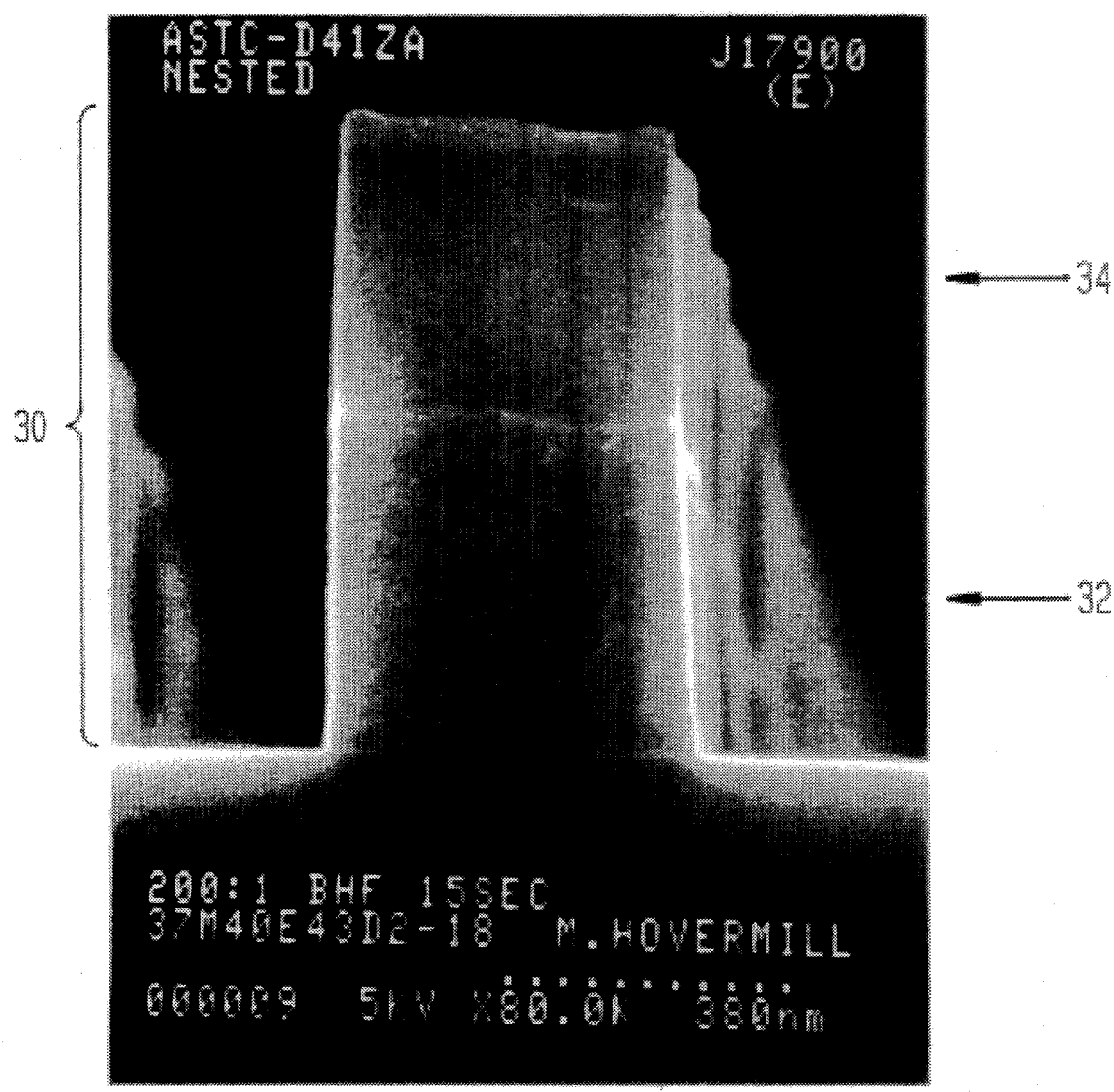
FIGS. 2A–2C are SEM photographs of anisotropic profiles achieved for different gate stack configurations.
Figure 2B:
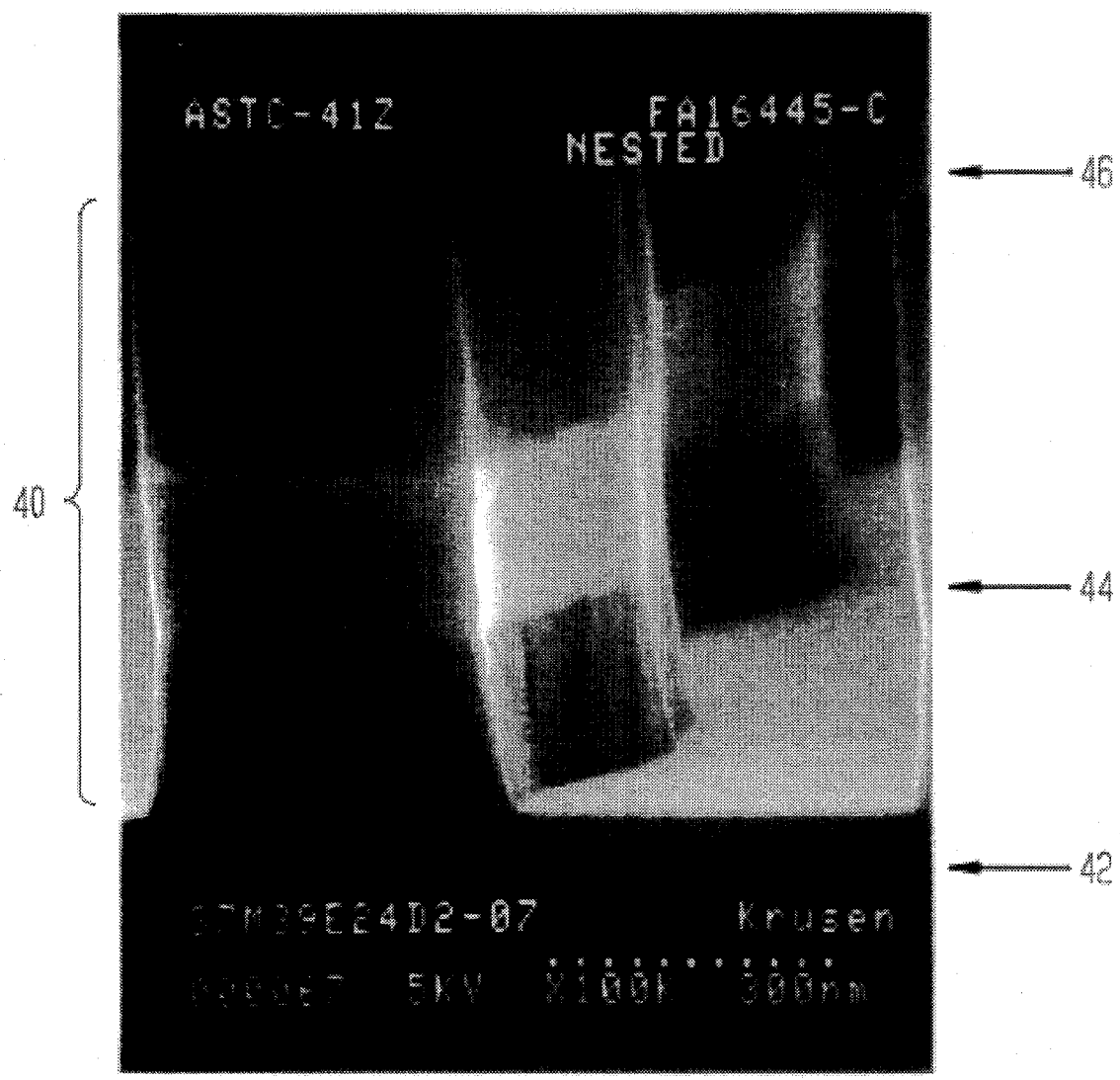
Figure 2C:
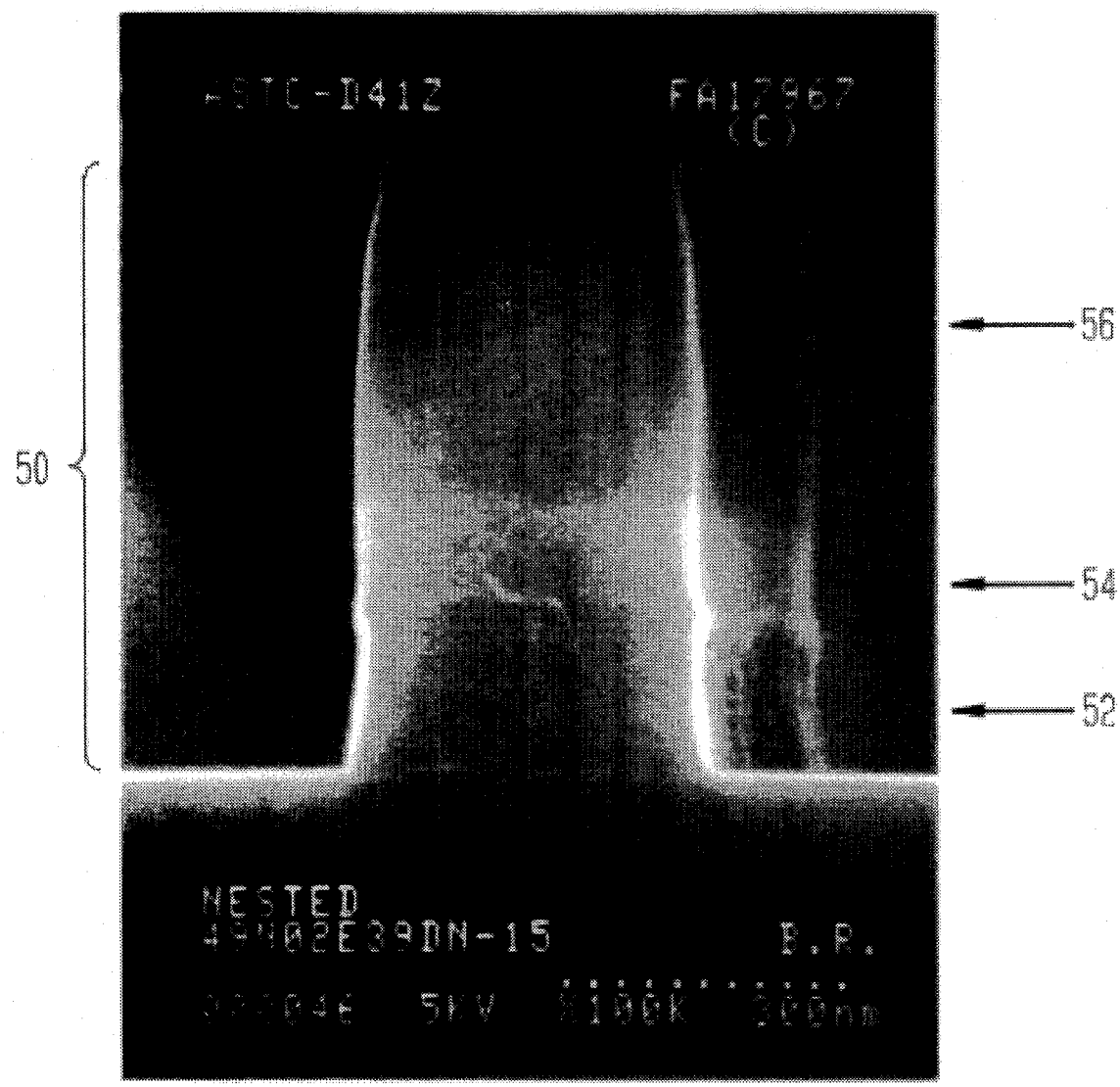

FIGS. 2A–2C are SEM photos of three different gate stack configurations fabricated according to the present invention. In FIG. 2A, gate stack 30 comprises an n-doped polysilicon stud 32 and an oxide cap 34. In FIG. 2B, gate stack 40 comprises a polysilicon stud 42 covered by a layer 44 of sputtered WSi. The layer 44 is covered by an oxide cap 46. In FIG. 2C, gate stack 50 comprises a polysilicon stud 52 covered by a TiSi layer 54. The TiSi layer 54 is capped by a cap oxide layer 56.

As can be seen in FIGS. 2A–2C, anisotropic etch profiles were achieved for each of these different gate stack configurations. No undercutting or notching can be observed in these photos due to the lower ion and radical densities which are characteristic of the low power etching technique of the present invention. Further, since undercutting and notching is substantially eliminated, additional side wall passivation is not needed, hence critical dimension changes are minimized as earlier discussed. The low power etching technique of the present invention also substantially reduces the non-uniformity of the plasmas and the resulting charging damage associated therewith.

It should be understood that the embodiment described herein is merely exemplary and that a person skilled in the art may make many variations and modifications to the embodiment utilizing functionally equivalent elements to those described herein. Any and all such variations or modifications as well as others which may become apparent to those skilled in the art, are intended to be included within the scope of the invention as defined by the appended claims.

I/we claim:

1. A method for fabricating a stacked gate array on a semiconductor wafer, comprising the steps of:

providing a reaction chamber having an upper inductive means and a lower capacitive means;

adjusting said upper inductive means to a power setting of substantially less than 300 watts;

placing said wafer into said reaction chamber; and plasma etching said wafer to provide said stacked gate array.

2. The method according to claim 1, wherein said stacked gate array comprises a layer of n-doped polysilicon and a layer of oxide.

3. The method according to claim 1, wherein said stacked gate array comprises a layer of polysilicon, a layer of tungsten silicon and a layer of oxide.

4. The method according to claim 1, wherein said stacked gate array comprises a layer of polysilicon, a layer of titanium silicon and a layer of oxide.

5. The method according to claim 1, wherein said step of plasma etching comprises the steps of:

feeding at least one etching gas into said reaction chamber; and energizing said inductive and capacitive means to convert said at least one etching gas into a plasma to etch said wafer.

6. The method according to claim 5, further comprising the step of evacuating said reaction chamber before said step of plasma etching.

7. The method according to claim 5, wherein said at least one etching gas comprises four etching gases.

8. The method according to claim 7, wherein one of said four etching gases comprises HCL.

9. The method according to claim 7, wherein one of said four etching gases comprises $CL_2$.

10. The method according to claim 7, wherein one of said four etching gases comprises $N_2$.

11. The method according to claim 7, wherein one of said four etching gases comprises $O_2$.

12. The method according to claim 1, wherein said power of said upper inductive means is adjusted to between about 0 and 200 watts.

13. The method according to claim 1, wherein said power of said lower capacitive means is adjusted to between about 50 and 200 watts.

14. The method according to claim 1, further comprising the step of adjusting said lower capacitive means to a power setting of substantially less than 300 watts.

15. The method according to claim 14, wherein said power of said upper inductive means is adjusted to between about 0 and 200 watts and said power of said lower capacitive means is adjusted to between about 50 and 200 watts.

16. A method for fabricating a sub-micron gate stack comprised of a plurality of layers on a semiconductor wafer, said method comprising the steps of:

providing a reaction chamber having an upper inductive coil and a lower capacitive electrode;

adjusting said upper inductive coil to a power setting of about 0 to 200 watts;

placing said wafer into said reaction chamber;

evacuating said reaction chamber; and etching said wafer with a plasma to provide said stacked gate array.

17. The method according to claim 16, wherein said step of etching comprises the steps of:

feeding a plurality etching gases into said reaction chamber; and energizing said coil and said electrode to convert said etching gases into said plasma to etch said wafer.

18. The method according to claim 16, wherein said etching gases comprises HCL, $CL_2$, $N_2$ and $O_2$.

19. The method according to claim 16, wherein said power of said lower capacitive electrode is adjusted to a power setting of between 50 and 200 watts.

20. A method for fabricating a sub-micron gate stack on a semiconductor wafer, said method comprising the steps of:

forming a polysilicon layer on said wafer;

forming an oxide layer over said polysilicon layer;

placing said wafer into a reaction chamber having an upper inductive coil and a lower capacitive electrode;

adjusting said upper inductive coil to a power setting of substantially less than 300 watts;

evacuating said reaction chamber; and feeding a plurality etching gases into said reaction chamber; and energizing said coil and said electrode to convert said etching gases into a plasma to etch said layers of said wafer to form said sub-micron gate stack.

* * * * *